US009905495B2

(12) United States Patent
Lin (10) Patent No.: US 9,905,495 B2
(45) Date of Patent: Feb. 27, 2018

(54) THERMAL MODULE (71) Applicant: Asia Vital Components Co., Ltd., New Taipei (TW)

(72) Inventor: Sheng-Huang Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 15/494,026

(22) Filed: Apr. 21, 2017

(65) Prior Publication Data
US 2017/0229376 A1 Aug. 10, 2017

Related U.S. Application Data

(63) Continuation of application No. 13/084,557, filed on Apr. 12, 2011.

(30) Foreign Application Priority Data

Feb. 25, 2011 (TW) .............................. 100106354 A (51) Int. Cl.
*H01L 23/367* (2006.01)
*H01L 23/427* (2006.01)
(Continued)

(52) U.S. Cl.
CPC ........ *H01L 23/427* (2013.01); *F28D 15/0275* (2013.01); *H01L 21/4878* (2013.01); *H01L 23/3672* (2013.01)

(58) Field of Classification Search
CPC . H01L 23/3672; H01L 23/467; H01L 23/427; F28D 15/0275
(Continued)

(56) References Cited

U.S. PATENT DOCUMENTS 7,768,784 B2 * 8/2010 Lai .................. H01L 23/4093
165/104.33
8,120,917 B2 * 2/2012 Tan .................... H01L 23/36
165/104.33
(Continued)

FOREIGN PATENT DOCUMENTS

CN      2930230 Y   8/2007
CN    101018469 A   8/2007
(Continued)

*Primary Examiner* — Devon Russell
(74) *Attorney, Agent, or Firm* — Nikolai & Mersereau, P.A.; C. G. Mersereau (57) ABSTRACT

A thermal module is disclosed. The thermal module includes a radiating fin assembly and a base. The base has a bottom and a plurality of slot vertically extending through the base in a thickness direction thereof. The radiating fin assembly includes a plurality of radiating fins, each of which has a heat-dissipation end and a heat-absorption end. The heat-absorption ends are correspondingly extended through the slots and bent to bear on the bottom for contacting with a heat-producing element. Heat produced by the heat-producing element is absorbed by the heat-absorption ends and directly transferred from the heat-absorption ends to the heat-dissipation ends without the problem of thermal resistance. Therefore, upgraded heat transfer efficiency and excellent heat dissipation effect can be achieved with the thermal module.

6 Claims, 7 Drawing Sheets

(51) Int. Cl.
*H01L 21/48* (2006.01)
*F28D 15/02* (2006.01)

(58) Field of Classification Search
USPC ............... 165/80.3, 185, 104.33; 29/890.039
See application file for complete search history.

(56) References Cited

U.S. PATENT DOCUMENTS

| | | | |
|---|---|---|---|
| 8,225,846 B2* | 7/2012 | Lin | H01L 23/3672 165/104.33 |
| 8,325,484 B2* | 12/2012 | Lo | G06F 1/20 165/104.33 |
| 2006/0070721 A1* | 4/2006 | Chen | F28D 15/0275 165/80.3 |
| 2009/0194255 A1* | 8/2009 | Huang | G06F 1/20 165/80.3 |
| 2010/0319880 A1* | 12/2010 | Yu | H01L 23/427 165/104.26 |
| 2011/0096502 A1* | 4/2011 | Li | H01L 23/4006 361/700 |
| 2011/0168358 A1* | 7/2011 | Wu | F28D 15/0266 165/104.26 |

FOREIGN PATENT DOCUMENTS

| | | |
|---|---|---|
| TW | M304201 | 6/1995 |
| TW | 468103 | 12/2001 |

* cited by examiner

THERMAL MODULE

CROSS-REFERENCE TO RELATED APPLICATIONS

This application claims the priority benefit of Taiwan patent application number 100106354 filed on Feb. 25, 2011; this present application is a continuation of U.S. patent application Ser. No. 13/084,557, filed on Apr. 12, 2011.

FIELD OF THE INVENTION

The present invention relates to a thermal module and more particularly to a thermal module capable of reducing thermal resistance to effectively upgrade heat transfer efficiency thereof.

BACKGROUND OF THE INVENTION

In the present computer-related industrial fields, a passive-type heat sink is usually tightly attached to a heat-producing surface of an electronic element, such as a central processing unit (CPU), a south and north chip set, etc., so that the produced heat can be effectively carried away from the electronic element to dissipate into ambient air, ensuring the heat-producing electronic element to operate at a proper working temperature.

Figure 1A:
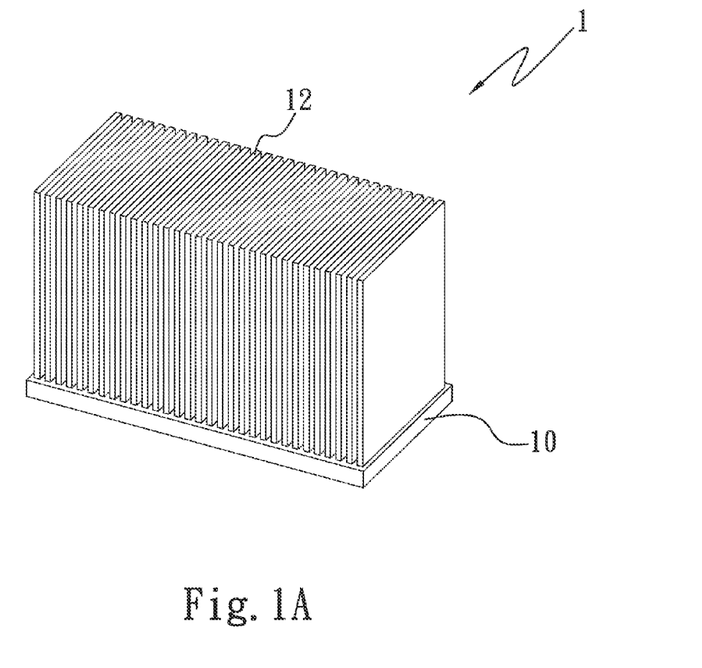
FIG. 1A is a schematic assembled perspective view of a conventional heat sink.
Figure 1B:
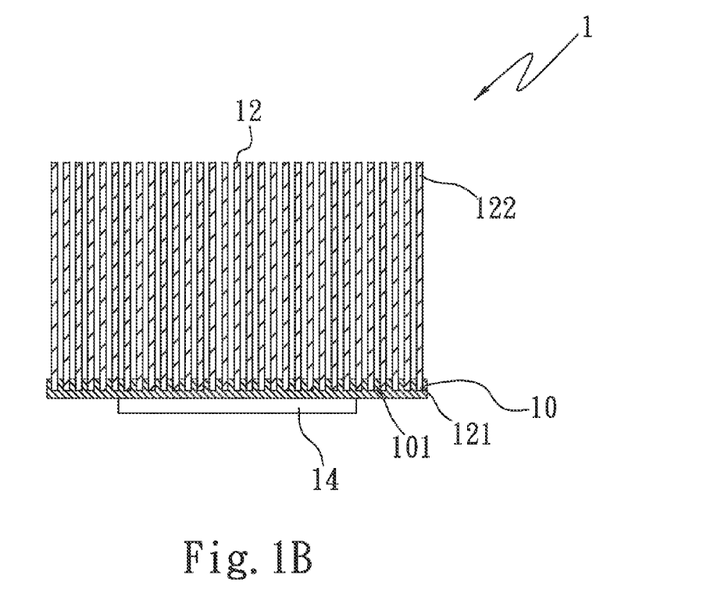
FIG. 1B is a vertical sectional view of FIG. 1A.

Conventionally available heat sinks can be generally divided into two types, namely an integral heat sink and an assembled heat sink. The integral heat sink mainly has a base, one side of which is in direct contact with a heat source and the other side of which is formed into a plurality of outward extended radiating fins for radiating heat absorbed by the base into ambient air. The assembled heat sink 1, as shown in FIGS. 1A and 1B, includes a base 10 and a plurality of radiating fins 12 assembled to the base 10. The base 10 is formed with a plurality of slots 101 sunken into an upper side of the base 10 for the radiating fins 12 to correspondingly insert therein. A lower side of the base 10 is in contact with a heat-producing element 14, such as a CPU or a south and north bridge chipset, for absorbing the heat produced by the heat-producing element 14.

Each of the radiating fins 12 has a heat-absorption end 121 and a heat-dissipation end 122 extended from the heat-absorption end 121. The heat-absorption ends 121 of the radiating fins 12 are correspondingly held in the slots 101, so that the base 10 and the radiating fins 12 together form the heat sink 1. When the heat-producing element 14 produces heat, the base 10 absorbs the produced heat and guides the absorbed heat to the heat-absorption ends 121 correspondingly held in the slots 101, and then the heat-absorption ends 121 further transfer the received heat to the heat-dissipation ends 122, from where the heat is radiated into ambient air and diffused.

While the two types of conventional heat sinks all can achieve the purpose of carrying heat away from the heat-producing element 14, they do not provide good heat dissipation effect. This is because the heat produced by the heat-producing element 14 is first transferred to the base 10 and then indirectly transferred to the radiating fins 12 via the base 10. Thermal resistance tends to occur during the process of transferring the heat from the base 10 to the radiating fins 12 to thereby result in lowered heat transfer efficiency and accordingly poor heat dissipation effect.

In conclusion, the conventional heat sinks have the following disadvantages: (1) having low heat transfer efficiency; (2) indirect heat transfer from the heat source via the base to the radiating fins causing the problem of thermal resistance; and (3) providing poor heat dissipation effect.

It is therefore tried by the inventor to develop an improved thermal module that eliminates the drawbacks in the conventional heat sinks to provide upgraded heat transfer efficiency and excellent heat dissipation effect.

SUMMARY OF THE INVENTION

A primary object of the present invention is to provide a thermal module capable of reducing thermal resistance to enable upgraded heat transfer efficiency thereof.

Another object of the present invention is to provide a thermal module providing excellent heat dissipation effect.

To achieve the above and other objects, the thermal module according to the present invention includes a base having a plurality of slots and a bottom, the slots vertically extending through the base in a thickness direction thereof; and a radiating fin assembly having a plurality of radiating fins, each of the radiating fins having a heat-dissipation end and a heat-absorption end extended from the heat-dissipation end. The heat-absorption ends of the radiating fins are respectively extended through the slots to downward project from the base, and the downward projected heat-absorption ends are bent to bear on the bottom of the base, so that the base and the radiating fin assembly are associated with one another to form an integral unit to complete the thermal module. With the above arrangements, the heat-absorption ends are in direct contact with a heat-producing element to absorb the heat produced by the latter, and the absorbed heat is directly guided from the heat-absorption ends of the radiating fins to the heat-dissipation ends for dissipation. In this manner, it is able to effectively reduce the thermal resistance and increase an overall heat transfer efficiency of the thermal module for the same to provide excellent heat dissipation effect.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and with reference to the accompanying drawings. For the purpose of easy to understand, elements that are the same in the preferred embodiments are denoted by the same reference numerals.

Figure 2A:
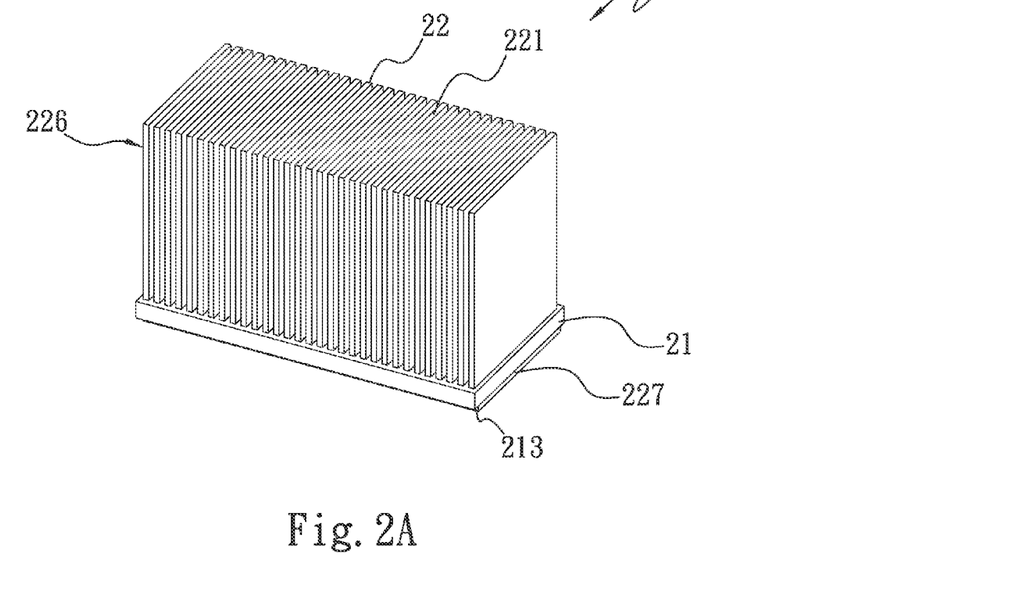
FIG. 2A is a schematic assembled perspective view of a thermal module according to a first preferred embodiment of the present invention.
Figure 2B:
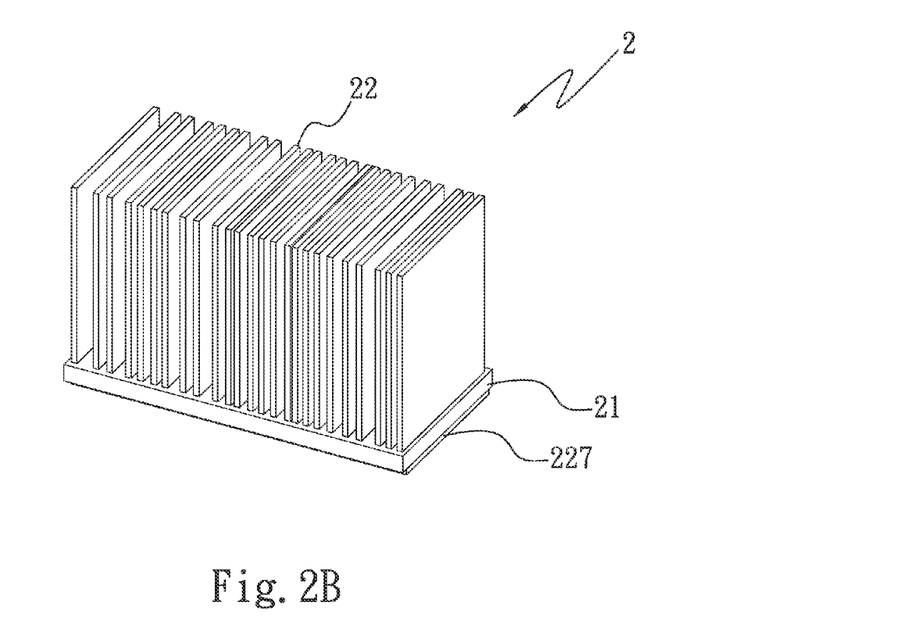
FIG. 2B is a schematic assembled perspective view of a variant of the thermal module according to the first preferred embodiment of the present invention.
Figure 3:
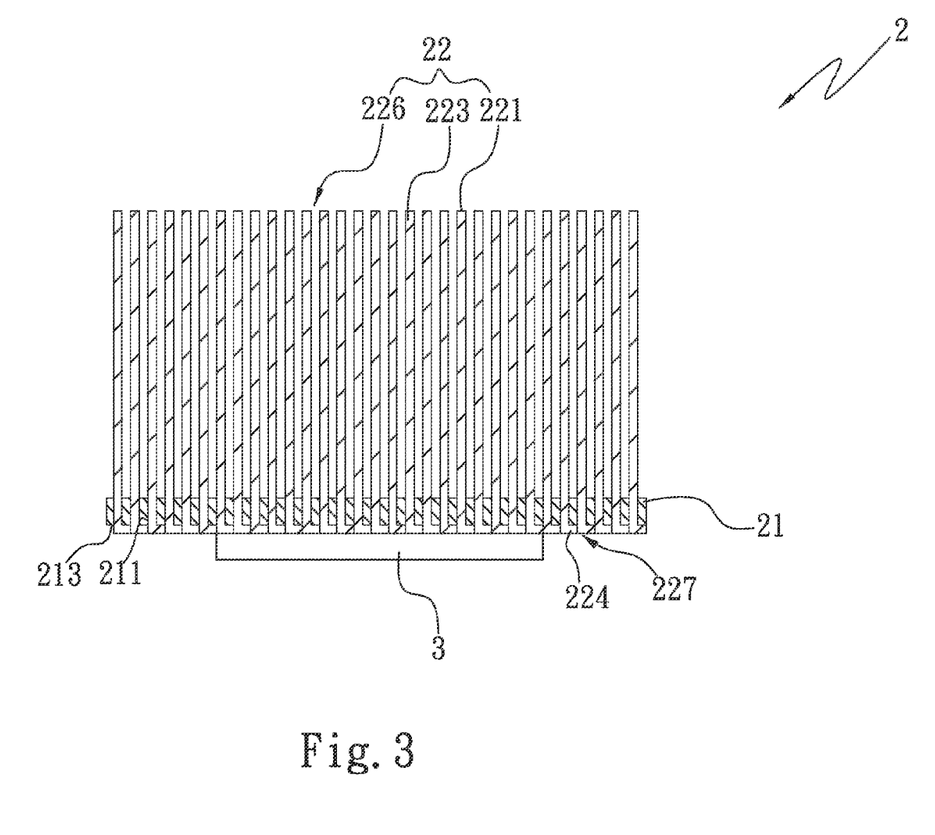
FIG. 3 is a vertical sectional view of FIG. 2A.
Figure 4:
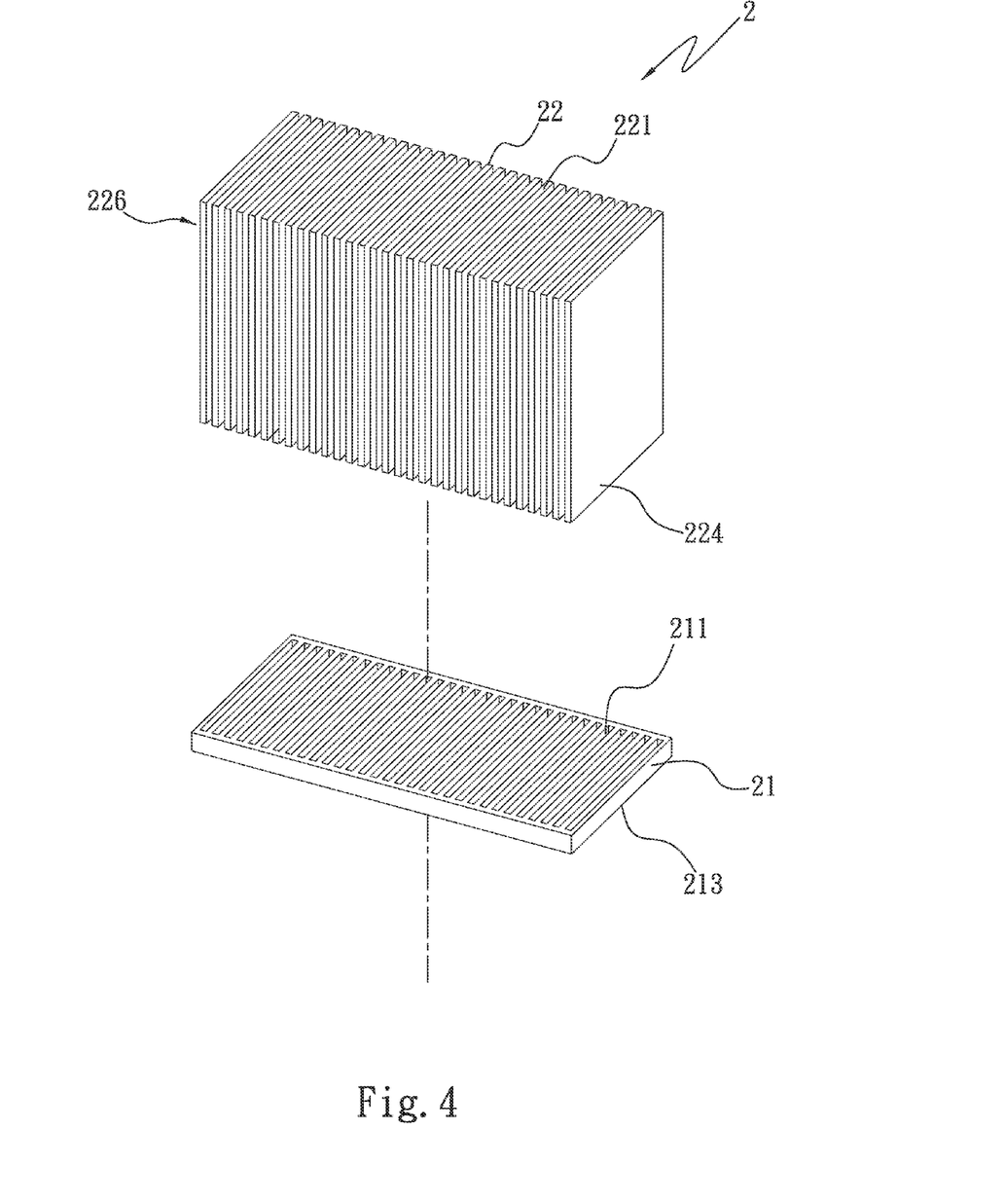
FIG. 4 is an exploded perspective view of the thermal module according to the first preferred embodiment of the present invention.

Please refer to FIGS. 2A, 3 and 4, in which a thermal module 2 according to a first preferred embodiment of the present invention is shown. As shown, the thermal module 2 includes a base 21 and a radiating fin assembly 22. The base 21 has a plurality of slots 211 and a bottom 213. The slots 211 are formed on the base 21 to respectively vertically extend through the base 21 in a thickness direction thereof. In FIG. 2A, the slots 211 are parallelly and equally spaced on the base 21. Alternatively, according to a variant of the first preferred embodiment as shown in FIG. 2B, the slots 211 can also be parallelly but non-equally spaced on the base 21.

The radiating fin assembly 22 includes a plurality of radiating fins 221, each of which has a heat-dissipation end 223 and a heat-absorption end 224. The heat-dissipation ends 223 of all the radiating fins 221 together define a heat-dissipation section 226, at where heat absorbed by the radiating fins 221 is dissipated into ambient air through heat exchange between the radiating fin assembly 22 and the ambient air. The heat-absorption ends 224 of the radiating fins 221 are correspondingly extended through the slots 211 to downward project from the base 21, and the downward projected heat-absorption ends 224 are mechanically bent by way of, for example, rolling or stamping to thereby tightly bear on the bottom 213 of the base 21, so that the radiating fins 221 are firmly associated with the base 21 to form an integral unit to complete the thermal module 2.

Please refer to FIGS. 2A and 3. As can be seen from FIG. 3, the heat-absorption ends 224 downward projected from the slots 211 after bending are oriented perpendicular to the heat-dissipation ends 223 of the radiating fins 221; and the bent heat-absorption ends 224 of the radiating fins 221 together define a heat-absorption section 227 for bearing on a heat-producing element 3, such as a CPU, a south and north bridge chipset, a graphics chip or other heat source, to absorb heat produced by the heat-producing element 3, so that the absorbed heat is directly transferred from the heat-absorption section 227 to the heat-dissipation section 226 for diffusing and dissipating into ambient air.

With the design of the present invention, the absorbed heat is directly guided from the heat-absorption section 227 of the radiating fins 221 to the heat-dissipation section 226 for dissipation. In this manner, it is able to effectively reduce the thermal resistance and increase an overall heat transfer efficiency of the thermal module for the same to provide excellent heat dissipation effect.

Figure 5:
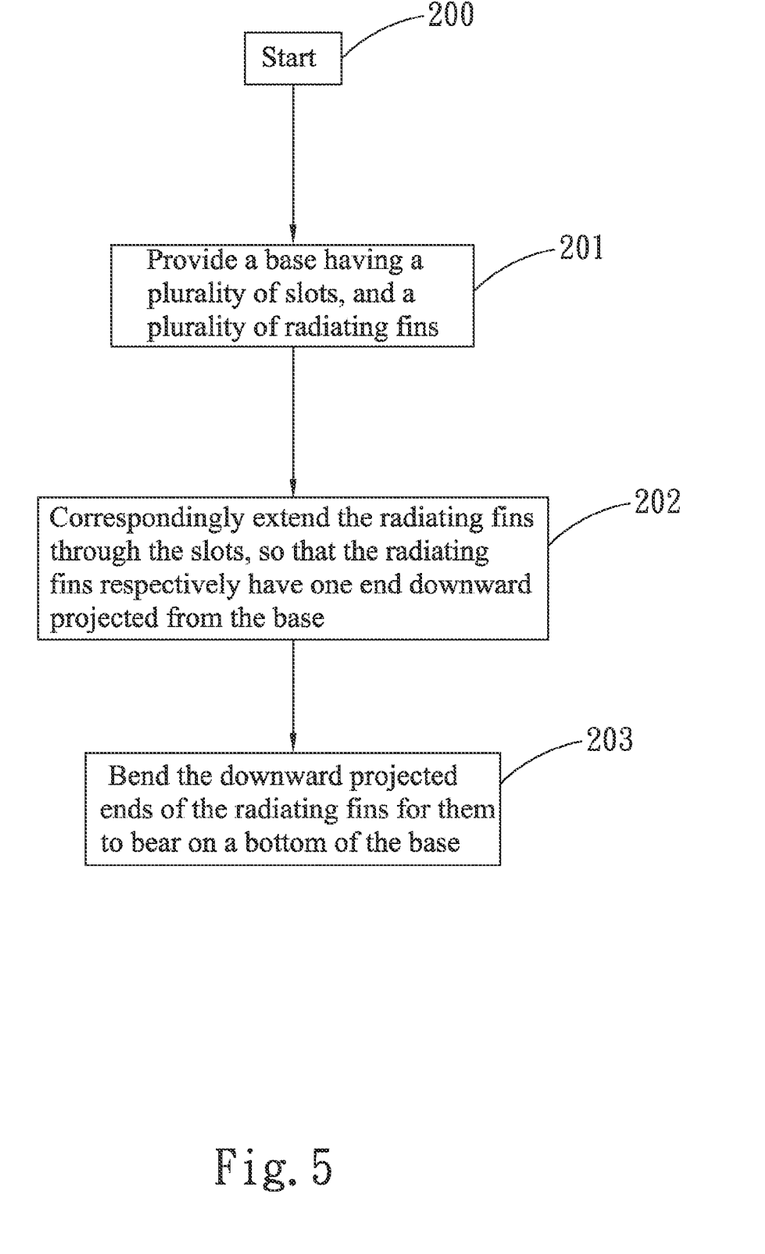
FIG. 5 is a flowchart showing the steps included in a method of manufacturing the thermal module according to the first preferred embodiment of the present invention.

Please refer to FIGS. 3 and 5 at the same time. FIG. 5 is a flowchart showing the steps included in a method of manufacturing the thermal module 2 according to the first preferred embodiment of the present invention.

In a first step 200, the manufacturing process starts.

In a second step 201, a base having a plurality of slots, and a plurality of radiating fins are provided.

More specifically, a base 21 having a plurality of slots 211 as well as a plurality of radiating fins 221 are provided. The slots 211 vertically extend through the base 21 in a thickness direction thereof, and can be parallelly arranged on the base 21 to equally space from one another, as shown in FIG. 2A, or to non-equally space from one another, as shown in FIG. 2B.

In a third step 202, the radiating fins are correspondingly extended through the slots to downward project their respective one end from the base.

More specifically, the radiating fins 221 are correspondingly extended through the slots 211 for their respective one end, i.e. the heat-absorption end 224, to downward project from the bottom 213 of the base 21.

And, in a fourth step 203, the ends of the radiating fins downward projected from the base are bent to bear on the bottom of the base.

More specifically, the heat-absorption ends 224 of the radiating fins 221 downward projected from the base 21 are mechanically bent by rolling or stamping for them to tightly bear on the bottom 213 of the base 21, so that the base 21 and the radiating fins 221 are associated with one another to form an integral unit to complete the thermal module 2.

When the thermal module 2 manufactured in the above-described method is used to carry heat from the heat-producing element 3, the occurrence of thermal resistance can be effectively avoided to enable a largely upgraded overall heat transfer efficiency and accordingly, excellent heat dissipation effect.

Figure 6:
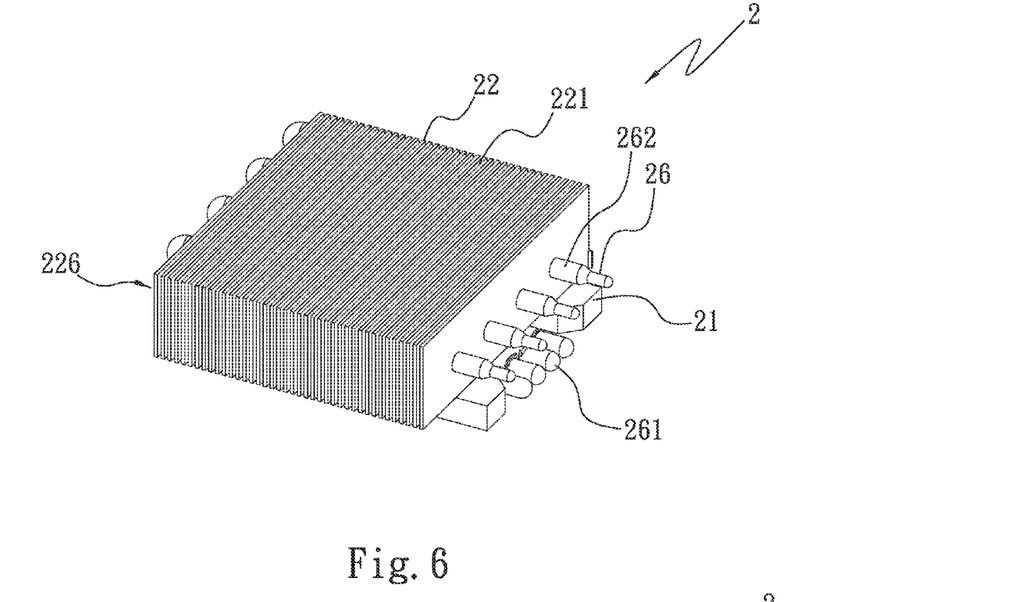
FIG. 6 is an assembled perspective view of a thermal module according to a second preferred embodiment of the present invention.
Figure 7:
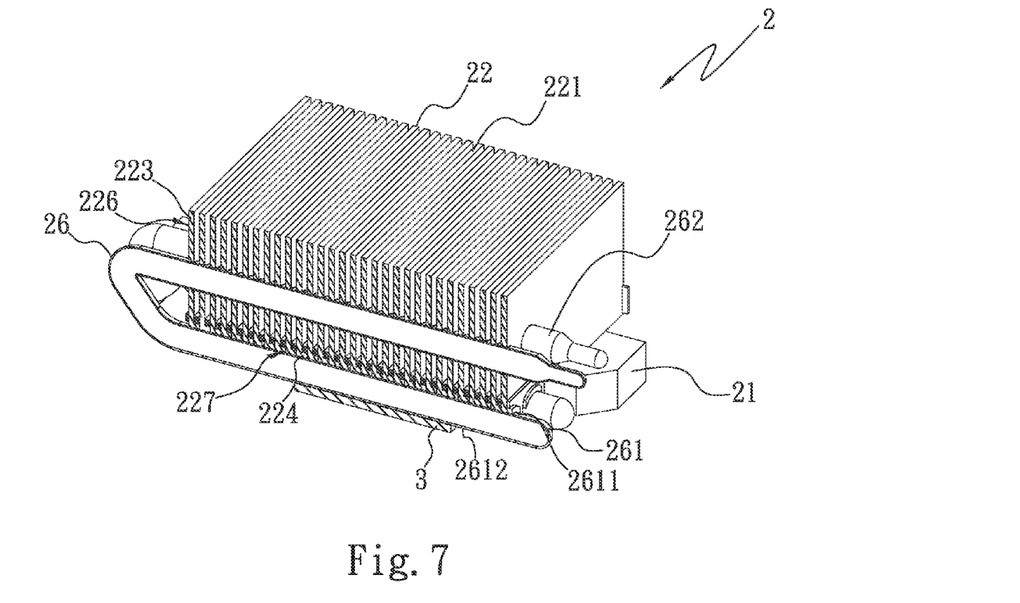
FIG. 7 is a vertically sectioned perspective view of the thermal module of FIG. 6.
Figure 8:
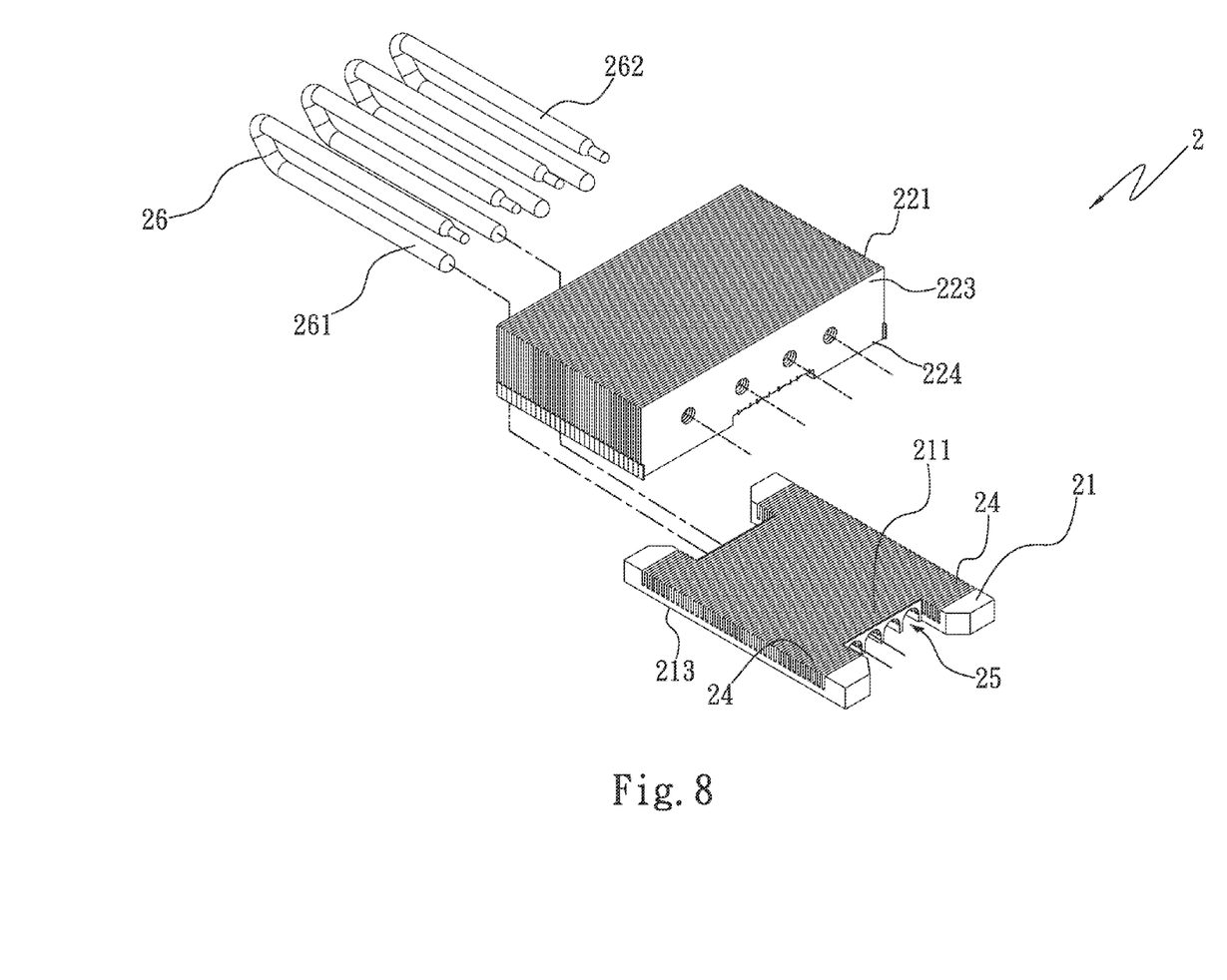
FIG. 8 is an exploded perspective view of the thermal module according to the second preferred embodiment of the present invention.

FIGS. 6, 7 and 8 illustrate a thermal module 2 according to a second preferred embodiment of the present invention. The thermal module 2 in the second preferred embodiment includes a base 21, a radiating fin assembly 22 having a plurality of radiating fins 221, and at least one heat pipe 26. Since the connection manner of the radiating fins 221 to the base and the structure of the radiating fin assembly 22 are generally similar to that in the first preferred embodiment, they are not repeatedly described herein. In the second preferred embodiment, the base 21 further has a plurality of coupling slots 24 and at least one downward opened recess 25. The coupling slots 24 are formed on the base 21 at locations between the slots 211 and outer sides of the base 21 for corresponding heat-absorption ends 224 to insert therein and accordingly be held thereto to assist in holding the radiating fins 221 in place. The recess 25 is formed on the bottom 213 and communicates with the slots 211, and the heat-absorption ends 224 are bent to bear on an inner wall surface of the recess 25.

While the illustrated second preferred embodiment are shown with four recesses and four heat pipes 26, it is understood the number of the heat pipes 26 and of the recesses 25 is not necessarily limited to four. In practical implementing of the present invention, a user may determine the number of the recesses 25 and of the heat pipes 26 according to the actually available heat dissipation space and the required heat dissipation effect.

Please refer to FIG. 7 along with FIG. 8. Each of the heat pipes 26 includes a vaporizing end 261 and a condensing end 262. The condensing ends 262 are extended through the heat-dissipation section 226 of the radiating fin assembly 22. More specifically, the condensing ends 262 are parallelly extended at respective one end through the heat-dissipation ends 223. The vaporizing ends 261 are correspondingly fixed in the recesses 25. Each of the vaporizing ends 261 has a first side 2611 tightly bearing on the heat-absorption ends 224, i.e. the heat-absorption section 227, and a second side 2612 opposite to the first side 1611 for contacting with the heat-producing element 3.

When the heat-producing element 3 produces heat, the vaporizing ends 261 of the heat pipes 26 absorb the heat and transfer the absorbed heat to the condensing ends 262, and the condensing ends 262 in turn transfer the received heat to the heat-dissipation section 226 being extended through by the condensing ends 262, so that the heat transferred to the heat-dissipation section 226 is radiated from the heat-dissipation ends 223 of the radiating fins 221 into ambient air. Meanwhile, the heat-absorption section 227 would also absorb part of the heat produced by the heat-producing element 3, and the heat absorbed by the heat-absorption section 227 is directly transferred to the heat-dissipation section 226 for dissipating into ambient air through heat exchange between the air and the radiating fins 221. Therefore, the thermal module 2 according to the second preferred embodiment of the present invention provides double heat-absorption effect and avoids the problem of thermal resistance to thereby enable upgraded overall heat transfer efficiency and excellent heat dissipation effect.

In brief, compared to the conventional thermal modules, the present invention has the following advantages: (1) enabling upgraded heat transfer efficiency; (2) avoiding the occurrence of thermal resistance; and (3) providing excellent heat-dissipation effect.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A thermal module, comprising:
   a base having a plurality of slots, a plurality of coupling slots, at least one downward opened recess and a bottom, the slots vertically extending through the base in a thickness direction thereof; the recess being recessed at the bottom and communicable with the slots; the coupling slots being provided at locations between the slots and outer sides of the base and not extended all the way through the base;
   a radiating fin assembly having a plurality of radiating fins, each of the radiating fins having a heat-dissipation end and a heat-absorption end; the heat-absorption ends of the radiating fins having a first portion respectively extended through the slots to downward project from the base, and the downward projected heat-absorption ends being bent to directly bear on the bottom of the base, and the heat-absorption ends of the radiating fins having a second portion unbent and respectively inserted into the coupling slots and not extended beyond the coupling slots; and
   at least one heat pipe having a vaporizing end and a condensing end; the vaporizing end being correspondingly fitted in the recess, and having a first side tightly bearing on the heat-absorption ends of the radiating fins and a second side directly contacting with a heat-producing element; and the condensing end being extended through the heat-dissipation ends of the radiating fins.

2. The thermal module as claimed in claim 1, wherein the first portion of the heat-absorption ends after bending are oriented perpendicular to the heat-dissipation ends of the radiating fins.

3. The thermal module as claimed in claim 1, wherein the heat-absorption ends of the radiating fins together define a heat-absorption section.

4. The thermal module as claimed in claim 2, wherein the heat-dissipation ends of the radiating fins together define a heat-dissipation section.

5. The thermal module as claimed in claim 1, wherein the slots are parallelly arranged on the base to equally space from one another.

6. The thermal module as claimed in claim 1, wherein the slots are parallelly arranged on the base to non-equally space from one another.

* * * * *